United States Patent
Fragiacomo et al.

(10) Patent No.: US 10,950,691 B2
(45) Date of Patent: *Mar. 16, 2021

(54) POWER CONVERTER CIRCUIT HAVING A CONTROLLER FOR GENERATING A DRIVE SIGNAL FOR DRIVING AN ELECTRONIC SWITCH WITH HIGH AVALANCHE ROBUSTNESS

(71) Applicant: Infineon Technologies Austria AG, Villach (AT)

(72) Inventors: Giulio Fragiacomo, Villach (AT); Bjoern Fischer, Munich (DE); Rene Mente, Riegersdorf (AT); Armin Willmeroth, Friedberg (DE)

(73) Assignee: Infineon Technologies Austria AG, Villach (AT)

(*) Notice: Subject to any disclaimer, the term of this patent is extended or adjusted under 35 U.S.C. 154(b) by 10 days.

This patent is subject to a terminal disclaimer.

(21) Appl. No.: 16/600,162

(22) Filed: Oct. 11, 2019

(65) Prior Publication Data
US 2020/0044020 A1 Feb. 6, 2020

Related U.S. Application Data

(63) Continuation of application No. 15/685,228, filed on Aug. 24, 2017, now Pat. No. 10,475,880.

(30) Foreign Application Priority Data

Aug. 25, 2016 (DE) .................. 102016115805.4

(51) Int. Cl.
*H01L 29/06* (2006.01)
*H01L 29/78* (2006.01)
(Continued)

(52) U.S. Cl.
CPC ...... *H01L 29/0634* (2013.01); *H01L 29/7802* (2013.01); *H01L 29/7813* (2013.01);
(Continued)

(58) Field of Classification Search
None
See application file for complete search history.

(56) References Cited

U.S. PATENT DOCUMENTS 10,475,880 B2 * 11/2019 Fragiacomo .......... H02M 7/217
2003/0132450 A1   7/2003 Minato et al.
(Continued)

FOREIGN PATENT DOCUMENTS

CN    103915485 A      7/2014
DE    102006061994 A1  7/2008
(Continued)

OTHER PUBLICATIONS

Strzalkowski, Ireneusz, et al., "Dielectric constant and its temperature dependence for GaAs, CdTe, and ZnSe", Applied Physics Letters, vol. 28, No. 6, 1976, pp. 350-352.

*Primary Examiner* — Nicholas J Tobergte
*Assistant Examiner* — Kien C Ly
(74) *Attorney, Agent, or Firm* — Murphy, Bilak & Homiller, PLLC

(57) ABSTRACT

A power converter circuit includes an inductor and rectifier circuit having an inductor connected in series with an electronic switch, and a rectifier circuit, and a controller for generating a drive signal for driving the electronic switch. The electronic switch has drain, source and gate nodes, drift and compensation cells each including a drift region of a first doping type and a compensation region of a second doping type, and a control structure connected between the drift region of each of the drift and compensation cells and the source node. Each drift region is coupled to the drain node
(Continued)

and each compensation region cells is coupled to the source node. A first type doping concentration $N_1$ of the drift region is higher than a first doping level $L_1$, and a second type doping concentration $N_2$ of the compensation region is higher than a second doping level $L_2$.

26 Claims, 7 Drawing Sheets

(51) Int. Cl.
      *H02M 7/217*     (2006.01)
      *H01L 29/10*      (2006.01)
      *H02M 1/08*      (2006.01)

(52) U.S. Cl.
      CPC ........ *H01L 29/7816* (2013.01); *H02M 7/217* (2013.01); *H01L 29/1095* (2013.01); *H02M 1/08* (2013.01)

(56) References Cited

U.S. PATENT DOCUMENTS

| 2006/0038223 | A1* | 2/2006 | Darwish | H01L 29/1095 |
| | | | | 257/330 |
| 2008/0017897 | A1 | 1/2008 | Saito et al. | |
| 2011/0101501 | A1* | 5/2011 | Schulze | H01L 29/0634 |
| | | | | 257/611 |
| 2013/0105887 | A1* | 5/2013 | Zuniga | H01L 29/7835 |
| | | | | 257/330 |

FOREIGN PATENT DOCUMENTS

| DE | 102008061962 A1 | 6/2009 |
| DE | 102012216648 A1 | 3/2013 |
| DE | 102014111062 A1 | 4/2015 |
| JP | 2011216587 A | 10/2011 |
| KR | 20120131549 A | 12/2012 |

* cited by examiner

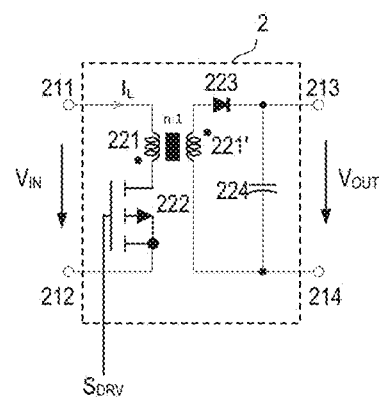
FIG 19
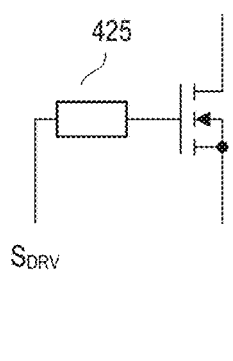 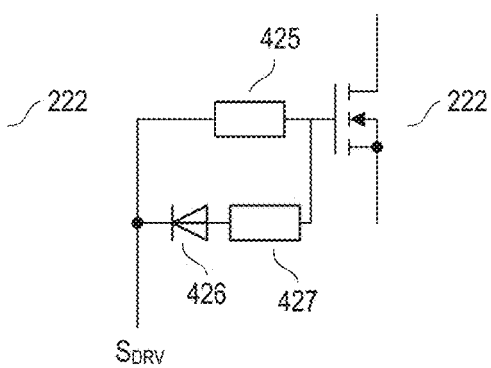 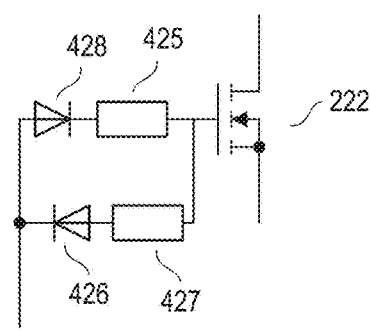
FIG 20A    FIG 20B    FIG 20C

POWER CONVERTER CIRCUIT HAVING A CONTROLLER FOR GENERATING A DRIVE SIGNAL FOR DRIVING AN ELECTRONIC SWITCH WITH HIGH AVALANCHE ROBUSTNESS

TECHNICAL FIELD

This disclosure in general relates to a transistor device, in particular a superjunction transistor device.

BACKGROUND

A superjunction transistor device, which often is also referred to as compensation transistor device, includes a device region with at least one region of a first doping type (conductivity type) and at least one region of a second doping type (conductivity type) complementary to the first doping type. The at least one region of the first doping type is often referred to as drift region, and the at least one region of the second doping type is often referred to as compensation region (although there are also publications where the overall region with the at least one region of the first doping type and at least one region of the second doping type is referred to as drift region). The drift region is coupled to a drain node and the compensation region is coupled to a source node of the transistor device.

A superjunction transistor device furthermore includes a control structure with a source region and a body region each coupled to the source node, and a gate electrode dielectrically insulated from the body region by a gate dielectric. This control structure defines an operation state of the transistor device. In an on-state there is conducting channel in the body region along the gate dielectric between the source region and the drift region. In the off-state, the conducting channel is interrupted. If, in the off-state, an external voltage is applied between the source node and drain node that reverse biases a pn-junction between the body region and the drift region and a pn-junction between the compensation region and the drift region a space charge region (depletion region) expands in each of the drift region and the compensation region.

In the off-state, the transistor device prevents a current flow between the drain node and the source node, unless the voltage between the source node and the drain node reaches a voltage level that is usually referred to as breakdown voltage level or, shorter, breakdown voltage. When the voltage reaches the breakdown voltage an avalanche breakdown occurs that causes an avalanche current to flow. The avalanche breakdown is associated with an acceleration of charge carriers in the drift region such that they create electron-hole pairs by impact ionization. Charge carriers created by impact ionization create new charge carriers, so that there is a multiplication effect.

Superjunction devices can be designed to withstand an avalanche current for a certain time. In the avalanche state a high amount of power may be dissipated in the transistor device which may finally result in a destruction due to overheating if the avalanche current prevails longer than the time it takes to reach the thermal limit, that is, to overheat the transistor device.

There is a need to provide a superjunction transistor device with a low on-resistance and a high avalanche robustness at a given voltage blocking capability.

SUMMARY

One example relates to a transistor device. The transistor device includes a drain node, a source node and a gate node, a plurality of drift and compensation cells each including a drift region of a first doping type and a compensation region of a second doping type complementary to the first doping type, and a control structure connected between the drift region of each of the drift and compensation cells and the source node. The drift region of each of the plurality of drift and compensation cells is coupled to the drain node and the compensation region of each of the plurality of drift and compensation cells is coupled to the source node. A first type doping concentration $N_1$ of the drift region is higher than a first doping level $L_1$ and a second type doping concentration $N_2$ of the compensation region is higher than a second doping level $L_2$, where $$L_1 > 1.2 \cdot \frac{\varepsilon_S \cdot E_C}{2 \cdot q \cdot w_1}, L_2 > 1.2 \cdot \frac{\varepsilon_S \cdot E_C}{2 \cdot q \cdot w_2},$$

and where $\varepsilon_S$ is the dielectric constant of a semiconductor material of the drift region and the compensation region, $E_C$ is the critical electric field for an avalanche breakdown of the semiconductor material, q is the elementary charge, $w_1$ is a width of the drift region in a direction perpendicular to the current flow direction, and $w_2$ is a width of the compensation region in the direction perpendicular to the current flow direction.

Another example relates to a transistor device. The transistor device includes a drain node, a source node and a gate node, a plurality of drift and compensation cells each including a drift region of a first doping type and a compensation region of a second doping type complementary to the first doping type, and a control structure connected between the drift region of each of the drift and compensation cells and the source node. The drift region of each of the plurality of drift and compensation cells is coupled to the drain node and the compensation region of each of the plurality of drift and compensation cells is coupled to the source node. Each of the plurality of drift and compensation cells, in the current flow direction of the transistor device, has a first end, a second end opposite the first end, a first intermediate position spaced apart from the first end and the second end, and a second intermediate position spaced apart from the first end and the second end. A first doping parameter of a first doping profile that represents the doping concentration of the drift region in the current flow direction monotonically increases between the first intermediate position and the first end, and a second doping parameter of a second doping profile that represents the doping concentration of the compensation region in the current flow direction monotonically increases between the second intermediate position and the second end.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIG. 19 shows a power converter circuit with a flyback converter topology; and

FIGS. 20A to 20C show examples of how an electronic switch in the power converter circuit may receive a drive signal.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
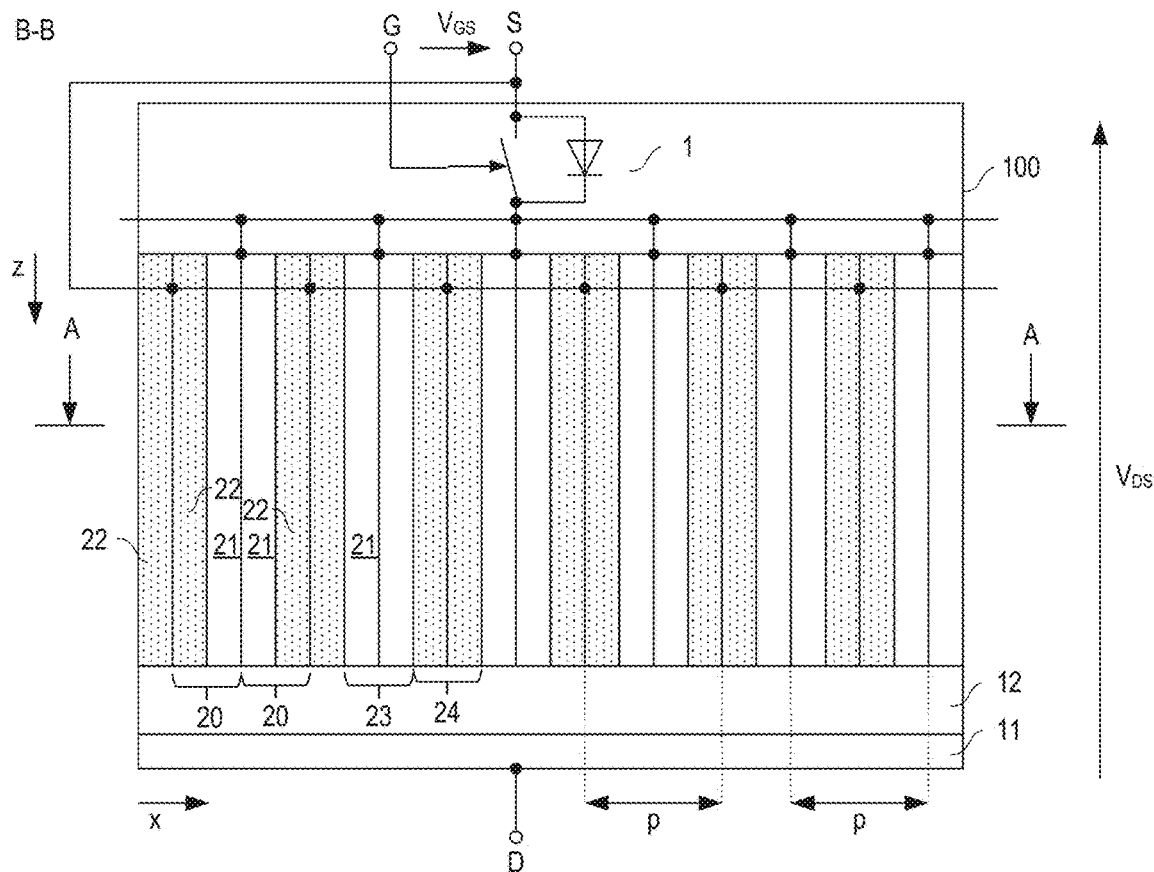
FIG. 1 schematically illustrates a vertical cross sectional view of a superjunction transistor device that includes a control structure and a plurality of drift and compensation cells.

FIG. 1 schematically illustrates a sectional view of one section of a transistor device, in particular, a superjunction transistor device. Referring to FIG. 1, the transistor device includes a semiconductor body 100 and a plurality of drift and compensation cells 20 in the semiconductor body 100. Each of the plurality of drift and compensation cells 20 includes at least one drift region 21 of a first doping type (conductivity type), at least one a compensation region 22 of a second doping type complementary to the first doping type. The first doping type is one of an n-type and a p-type, and the second doping type is the other one of the n-type and the p-type. The at least one drift region 21 and the at least one compensation region 22 of each drift and compensation cell adjoin each other so that each of the plurality of drift and compensation cells 20 includes at least one pn-junction between the at least one drift region 21 and the at least one compensation region. Just for the purpose of illustration, each of the drift and compensation cells 20 shown in FIG. 1 and the other examples explained below includes one drift region 21, one compensation region 22, and one pn-junction. This, however, is only an example. One drift and compensation cell may include more than one drift region and more than one compensation region as well. Further, in the example shown in FIG. 1, the drift regions 21 of neighboring drift and compensation cells 20 are formed by one semiconductor region 23 of the first doping type and the compensation regions 22 of neighboring drift and compensation cells 20 are formed by one semiconductor region 24 of the second doping type. A pitch p of the semiconductor structure with the semiconductor regions 23, 24 of the first and second doping type is given by a center distance between two neighboring semiconductor regions 23 of the first doping type or a center distance between two neighboring semiconductor regions 24 of the second doping type, respectively. In the example shown in FIG. 1, where a width of each drift region 21 in a first lateral direction x of the semiconductor body 100 is substantially 50% of a width of one semiconductor region 23 of the first doping type and where a width of each compensation region 22 in the first lateral direction x of the semiconductor body 100 is substantially 50% of a width of one semiconductor region 24 of the second doping type a width of each drift and compensation cell 20 in the first lateral direction is substantially 50% of the pitch p.

Referring to FIG. 1, the at least one drift region 21 of each drift and compensation cell 20 is connected to a drain node D of the transistor device, and the at least one compensation region 22 of each drift and compensation cell 20 is connected to a source node S of the transistor device. An electrical connection between the compensation cells 22 and the source node S is only schematically illustrated in FIG. 1. Examples of how these electrical connections can be implemented are explained with reference to examples herein further below. The drift regions 21 of the individual drift and compensation cells 20 are connected to the drain node D via a drain region 11 of the first doping type. The drain region 11 may adjoin the drift regions 21. This, however, is not shown in FIG. 1. Optionally, as shown in FIG. 1, a buffer region 12 of the first doping type is arranged between the drain region 11 and the drift regions 21 of the individual drift and compensation cells 20. The buffer region 12 has the first doping type, which is the doping type of the drift regions 21 and the drain region 11. According to one example, a doping concentration of the buffer region 12 is lower than a doping concentration of the drain region 11. The doping concentration of the drain region 11 is selected from a range of between $1E17$ $cm^{-3}$ and $1E20$ $cm^{-3}$, for example, and the doping concentration of the buffer region 12 is selected from a range of between $1E14$ $cm^{-3}$ and $1E176$ $cm^{-3}$, for example. According to one example, the buffer region 12 includes two or more differently doped sub-regions (not shown). One of these sub-regions may have a doping concentration of between $1E14$ $cm^{-3}$ and $1E15$ $cm^{-3}$, and another one of these sub-regions may have a doping concentration of between $1E15$ $cm^{-3}$ and $1E16$ $cm^{-3}$.

Referring to FIG. 1, the transistor device further includes a control structure 1 connected between the source node S and the at least one drift region 21 of each of the plurality of drift and compensation cells 20. The control structure 1 is at least partially integrated in a semiconductor body 100. Examples of how the control structure 1 may be implemented are explained with reference to examples herein further below. The control structure furthermore includes a gate node G and is configured to control a conducting channel between the source node S and the drift regions 21 of the individual drift and compensation cells 20 dependent on a voltage $V_{GS}$ between the gate node G and the source node S. This function of the control structure 1 is represented by a switch connected between the source node S and the drift regions 21 in the example shown in FIG. 1. Furthermore, the control structure 1 includes a pn-junction between the drift regions 21 and the source node S. This pn-junction is represented by a bipolar diode in the example shown in FIG. 1.

The semiconductor body 100 may include a conventional semiconductor material such as, for example, silicon (Si) or silicon carbide (SiC).

The transistor device has a current flow direction, which is a direction in which a current may flow between the source node S and the drain node D inside the semiconductor body. In the example shown in FIG. 1, the current flow direction is a vertical direction z of the semiconductor body 100. The vertical direction z is a direction perpendicular to a first surface (not shown in FIG. 1) and a second surface 102 that is formed by the drain region 11. FIG. 1 shows a vertical cross sectional view of the drift and compensation cells 20, the drain region 11, and the optional buffer region 12, which is a sectional view in a section plane perpendicular to the first and second surface and parallel to the vertical direction z. Section planes perpendicular to the vertical section plane shown in FIG. 1 are referred to as horizontal section planes in the following.

Figure 2:
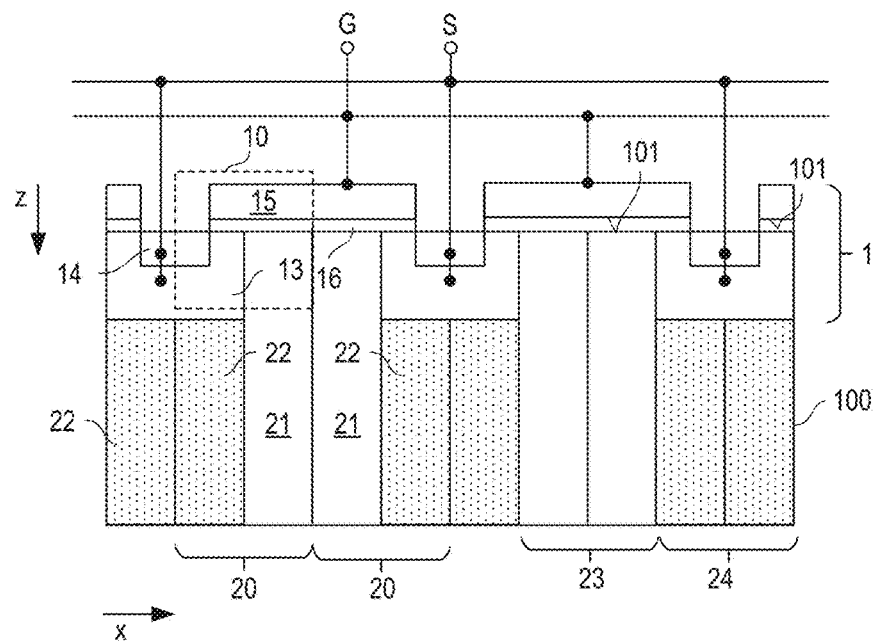
FIG. 2 illustrates one example of a control structure that includes a plurality of control cells.

FIG. 2 shows one example of the control structure 1 in a greater detail. Besides the control structure 1, portions of the drift and compensation cells 20 adjoining the control structure 1 are shown in FIG. 2. In the example shown in FIG. 2 the control structure 1 includes a plurality of control cells 10, which may also be referred to as transistor cells. Each of these control cells 10 includes a body region 13 of the second doping type, a source region 14 of the first doping type, a gate electrode 15, and a gate dielectric 16. The gate dielectric 16 dielectrically insulates that gate electrode 15 from the body region 13. The body region 13 of each control cell 10 separates the respective source region 14 of the control cell from a drift region 21 of at least one of the plurality of drift and compensation cells. The source region 14 and the body region 13 of each of the plurality of control cells 10 is electrically connected to the source node S.

"Electrically connected" in this context means ohmically connected, that is, there is no rectifying junction between the source node S and the source region 14 and the body region 13, respectively. The electrically connections between the source node S and the source region 14 and the body region 13 of the individual control cells are only schematically illustrated in FIG. 2. The gate electrode 15 of each control cell 10 is electrically connected to the gate node G.

Referring to the above, the body region 13 of each control cell adjoins the drift region 21 of at least one drift and compensation cell 20 so that a pn-junction is formed between the body region 13 and the at least one drift region 21. These pn-junctions form the pn-junction of the control structure 1 that is represented by the bipolar diode in the equivalent circuit diagram of the control structure 1 shown in FIG. 1.

In the example shown in FIG. 2, the gate electrode 15 of each control structure 10 is a planar electrode arranged on top of the first surface 101 of the semiconductor body 100 and dielectrically insulated from the semiconductor body 100 by the gate dielectric 16. In this example, sections of the drift regions 21 of the drift and compensation cells 20 extend to the first surface 101 adjacent the individual body regions 13.

Figure 3:
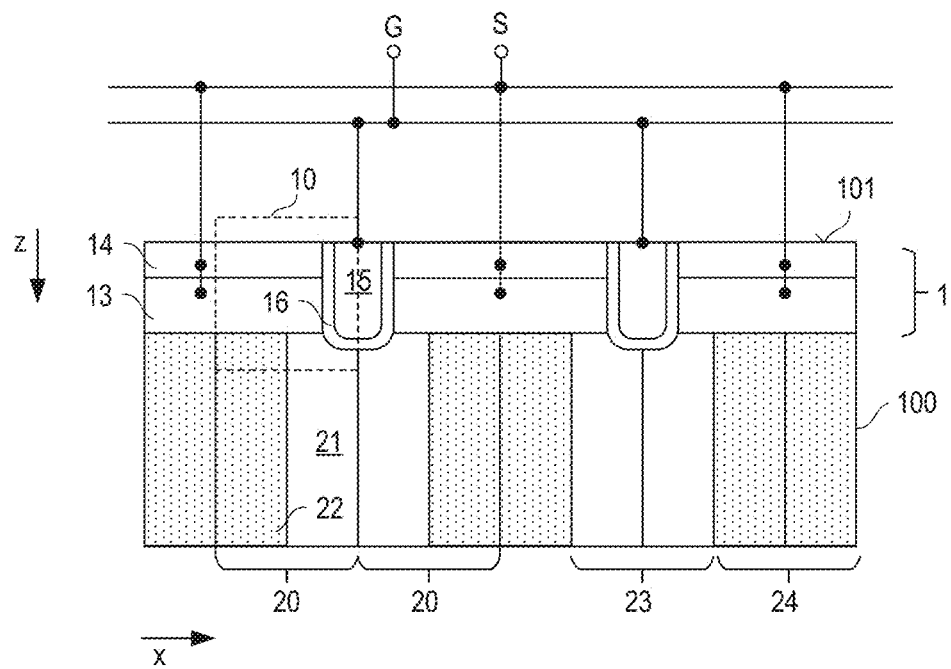
FIG. 3 illustrates another example of a control structure that includes a plurality of control cells.

FIG. 3 shows a control structure 1 according to another example. The control structure 1 shown in FIG. 3 is different from the control structure 1 shown in FIG. 2 in that the gate electrode 15 of each control cell 10 in the control structure 1 shown in FIG. 3 is a trench electrode. This gate electrode 15 is arranged in a trench that extends from the first surface 101 into the semiconductor body 100, whereas, like in the example shown in FIG. 2, a gate dielectric 16 dielectrically insulates the gate electrode 15 from the respective body region 13. The body region 13 and the source regions 14 of each control cell 10 is electrically connected to the source node S, and the body region 13 adjoins at the drift region 21 of at least one drift and compensation cells and forms a pn-junction with the respective drift region 21.

In each of the examples shown in FIGS. 2 and 3, one body region 13 adjoins one compensation region 22, so that the compensation regions 22 of the individual drift and compensation cells 20 are electrically connected to the source node S via the body regions 13 of the control cells 10 of the control structure 1.

In the example shown in FIGS. 2 and 3, the control structures 10 each include one gate electrode 15, wherein the gate electrode 15 of each control cell 10 is configured to control a conducting channel between the source region 14 of the respective control cell 10 and the drift region 21 of one drift and compensation cell 20, so that each control cell 10 is associated with one drift and compensation cell 20. Furthermore, in the examples, shown in FIGS. 1 and 2, one doped region of the first doping type forms the source regions 14 of two (or more) neighboring control cells 10, one doped region of the second doping type forms the body regions 13 of two (or more) neighboring control cells, and one electrode forms the gate electrode 15 of two or more control cells. The gate electrode 15 may include doped polysilicon, a metal, or the like. According to one example, a doping concentration of the source region 14 is selected from a range of between 1E18 cm$^{-3}$ and 1E21 cm$^{-3}$, and a doping concentration of the body region 13 is selected from a range of between 1E15 cm$^{-3}$ and 1E19 cm$^{-3}$.

Associating one control cell 10 of the plurality of control cells with one drift and compensation cell 20 of the plurality of drift and compensation cells as illustrated in FIGS. 2 and 3 is only an example. The implementation and the arrangement of the control cells 10 of the control structure 1 is widely independent of the specific implementation and arrangement of the drift and compensation cells 20.

Figure 4:
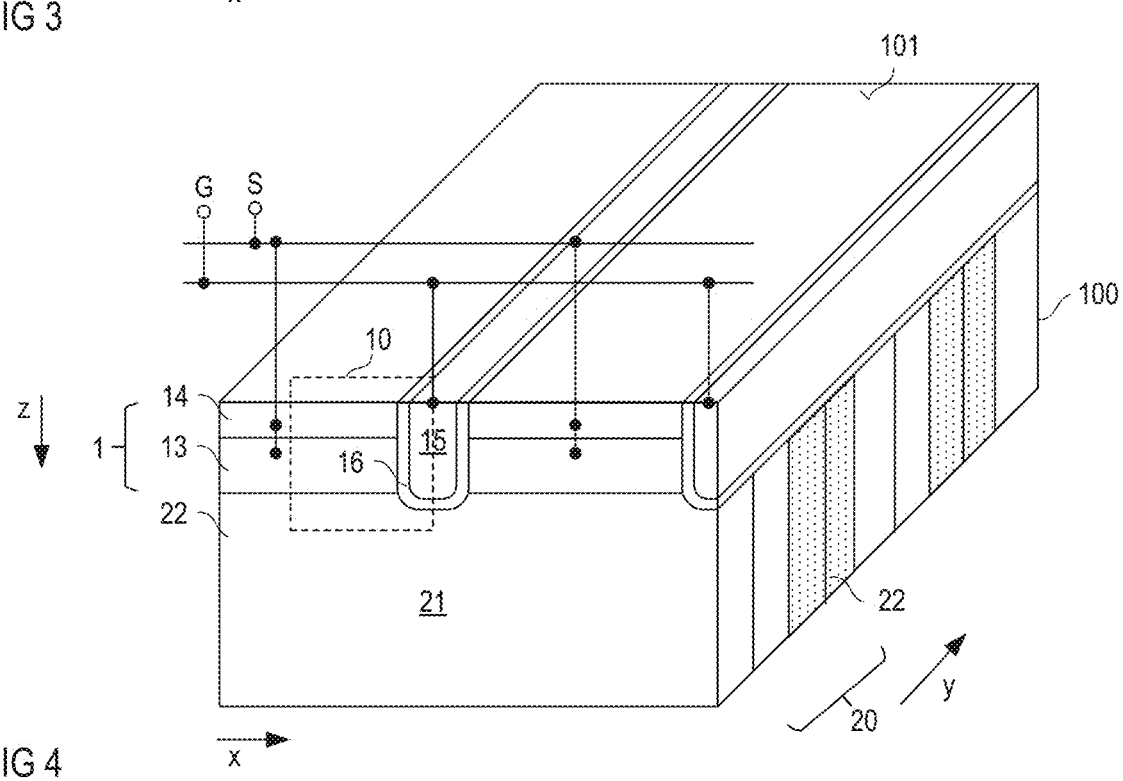
FIG. 4 shows a perspective sectional view of one section of a superjunction transistor device according to one example.

One example that illustrates that the implementation and arrangement of the control structure 1 is widely independent of the implementation and arrangement of the drift and compensation cells 20 is shown in FIG. 4. In this example, the drift regions 21 and compensation regions 22 are elongated in a first lateral direction x of the semiconductor body 100, while the source regions 14, the body regions 13, and the gate electrodes 15 of the individual control cells 10 of the control structure 1 are elongated in a second lateral direction y perpendicular to the first lateral direction x. In this example, the body region 13 of one control cell 10 adjoins the drift regions 21 of a plurality of drift and compensation cells 20.

The drift and compensation cells can be implemented in a variety of different ways. Some examples of how the drift and compensation cells 20 can be implemented are explained with reference to FIGS. 5, 6 and 7 below. Each of these figures illustrates a sectional view in section plane A-A shown in FIG. 1 of a region of the semiconductor body 100 in which the drift and compensation cells 20 are implemented.

Figure 5:
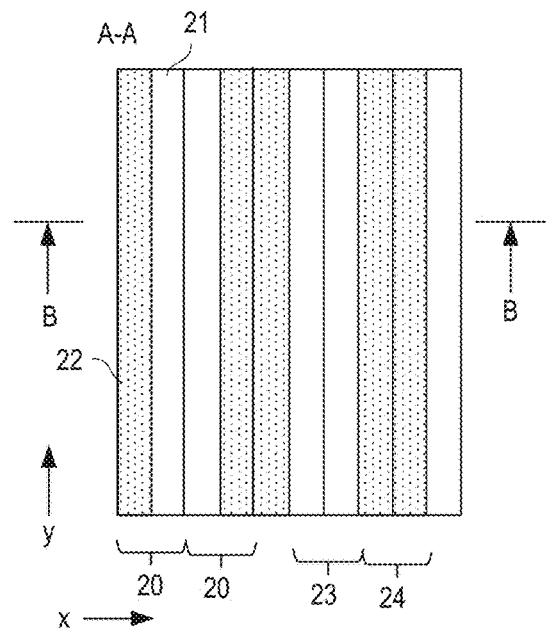
FIGS. 5 to 8 illustrate drift and compensation cells according to different examples.

In the example shown in FIG. 5, the drift regions 21 and compensation regions 22 of the individual drift and compensation cells 20 are elongated in one lateral direction of the semiconductor body 100. Just for the purpose of illustration, this lateral direction is the second lateral direction y in this example. In the first lateral direction x, semiconductor regions of the first doping type and semiconductor region of the second doping type are arranged alternately, whereas each of the semiconductor regions of the first doping type forms the drift regions 21 of two adjoining drift and compensation cells 20 and each of the semiconductor regions of the second doping type forms the compensation regions 22 of two adjoining drift and compensation cells 20.

Figure 6:
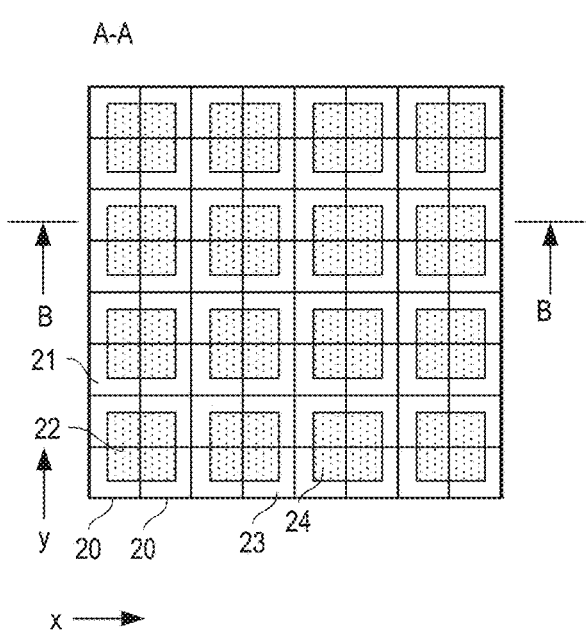

In the example shown in FIG. 6, the transistor device includes a plurality of semiconductor regions of the second doping type, with each of these semiconductor regions having a rectangular, in particular, square shape. These rectangular regions of the second doping type are surrounded by a contiguous first type semiconductor region that has the shape of a grid. In this topology, each of the second type semiconductor regions forms the compensation regions 22 of four adjacent drift and compensation cells 20. The drift regions 21 of the individual drift and compensation cells 20 are formed by the grid shaped first type semiconductor region. The individual drift and compensation cells have a rectangular, more particularly, a square shape in this embodiment.

Figure 7:
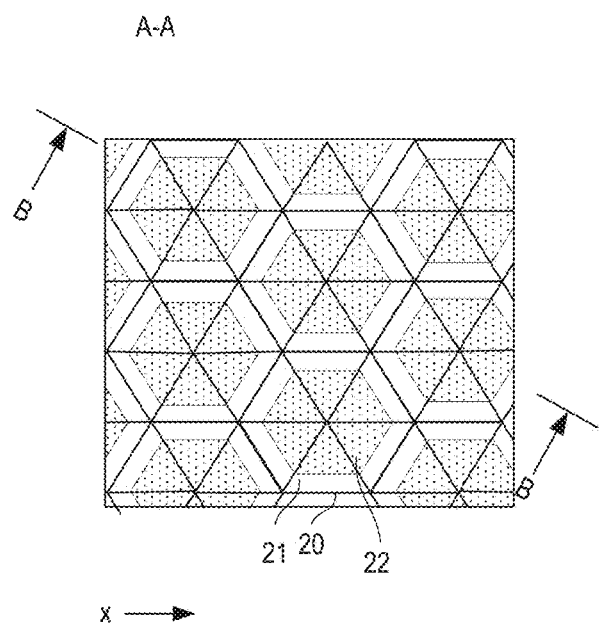

Implementing the drift and compensation cells 20 with a rectangular shape is only one example. FIG. 7 shows a modification of the drift and compensation cells 20 shown in FIG. 6. In the example shown in FIG. 7, the second type semiconductor regions forming the compensation regions 22 of several drift and compensation cells 20 have a hexagonal shape, so that the individual drift and compensation cells 20 have a triangular shape. However, this is just another example. The second type semiconductor regions forming the compensation regions 22 of several drift and compensation cells can be implemented with any type of polygonal, elliptical, or circular shape. Furthermore, the shape and the positions of the drift regions 21 and the compensation regions 22 can be mutually exchanged with each other.

Figure 8:
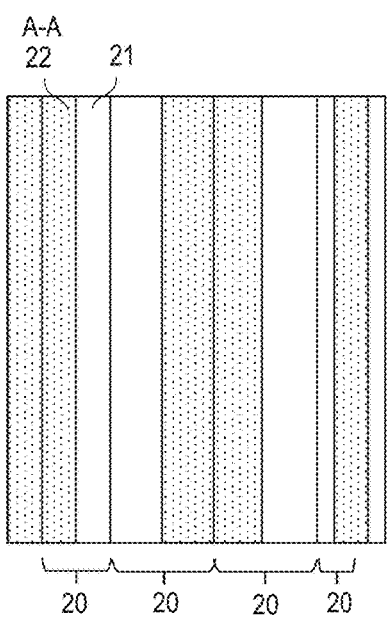

In the examples explained above, the individual drift and compensation cells 20 have substantially the same size. The size of one drift and compensation cells 20 is its size in the horizontal section plane A-A explained herein above. However, implementing the drift and compensation cells 20 with the same size is only one example. According to another example shown in FIG. 8, drift and compensation cells 20 with different sizes can be implemented in one transistor device. In the example shown in FIG. 8, the drift and compensation cells are elongated cells of the type explained with reference to FIG. 5. However, what is illustrated in FIG. 8 in accordance with elongated drift and compensation cells 20 can be applied to any other type of drift and compensation cells as well.

The functionality of the transistor device explained herein above is explained below. The transistor device can be operated in a forward biased state and a reverse biased state. Whether the device is in the forward biased state or the reverse biased state is dependent on a polarity of a drain-source voltage $V_{DS}$ between the drain node D and the source node S. In the reverse biased state the polarity of the drain-source voltage $V_{DS}$ is such that the pn-junctions between the body regions 13 and the drift regions 21 are forward biased, so that in this operation state the transistor device conducts a current independent of an operation state of the control structure 1. In the forward biased state, the polarity of the drain-source $V_{DS}$ is such that the pn-junctions between the body regions 13 and the drift regions 21 are reverse biased. In this forward biased state, the transistor device can be operated in an on-state or an off-state by the control structure 1. In the on-state, the control structure 1 generates a conducting channel between the source node S and the drift regions 21, and in the off-state this conducting channel is interrupted. More specifically, referring to FIGS. 2 and 3, in the on-state there are conducting channels in the body regions 13 between the source regions 14 and the drift regions 21 controlled by the gate electrode 15. In the off-state, these conducting channels are interrupted. The gate electrodes 15 are controlled by a gate-source voltage $V_{GS}$ between the gate node G and the source node S.

The transistor device can be implemented as an n-type transistor device or as a p-type transistor device. In an n-type transistor device, the first doping type, which is the doping type of the drift regions 21, the source regions 14, the drain region 11 and the optional buffer region 12 is an n-type and the second doping type, which is the doping type of the compensation regions 22 and the body regions 13, is a p-type. In a p-type transistor device, the doping types of the device regions mentioned before are complementary to the doping types of the respective device regions in an n-type transistor device. An n-type transistor device, for example, is in the forward biased state if the drain-source voltage $V_{DS}$ is a positive voltage. Furthermore, an n-type transistor device is in the on-state if the gate-source voltage $V_{GS}$ is positive and higher than a threshold voltage of the transistor device. In the following, drain-source voltage means a drain-source voltage that forward biases the transistor device, and on-state and off-state denote operation states in the forward biased state.

It is desirable to have a transistor device with a low specific on-resistance $R_{ON} \cdot A$ at a given voltage blocking capability and a high avalanche robustness. The specific on-resistance $R_{ON} \cdot A$ is the electric resistance between the drain node D and the source node S in the on-state multiplied with the size of the semiconductor body 100 in which the transistor device is integrated. In the examples explained before, the "size" of the semiconductor body is the area of the first surface 101, for example. The specific on-resistance and the avalanche robustness of the transistor device are mainly defined by the design of the drift and compensation cells 20. Examples of drift and compensation cell designs that result in a low specific on-resistance and a high avalanche robustness are explained below.

Figure 9:
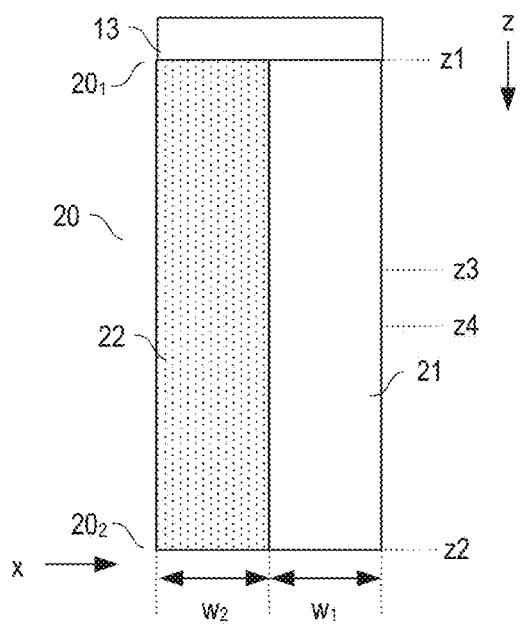
FIG. 9 shows an enlarged view of one drift and compensation cell.

FIG. 9 schematically illustrates a vertical cross sectional view one drift and compensation cell 20 and a section of a body region 13 adjoining the drift region 21 and the compensation region 22 of the drift and compensation cell 20. The drain region and other parts of the control structure 1 than the body region 13 are not shown in FIG. 9. In the off-state, the drain-source voltage $V_{DS}$ between the drain node and the source node S (see FIG. 1) reverse biases the pn-junction between the body region 13 and the drift region 21 and also the pn-junction between the drift region 21 and the compensation region 22. Reverse biasing these pn-junctions is associated with an expansion of depletion regions (space charge regions) in these device regions. The expansion of depletion regions is associated with an ionization of dopant atoms in the respective device regions. Just for the purpose of explanation it is assumed that the transistor device is an n-type transistor device so that the drift region 21 includes n-type dopants and the body region 13 and the compensation region 21 each include p-type dopants. Thus, the ionization of n-type dopants in the drift region 21 results in positive charges in the drift region 21 and the ionization of p-type dopants in the body region 13 and the compensation region 21 results in negative charges in the compensation region 21 and the body region, respectively. Each positive or negative charge in one of these device regions has a corresponding counter charge in another one of the device regions. That is, positive charges in the drift region 21 either have corresponding counter charges in the body region 13 or the compensation region 22. Depletion regions expanding in the drift region 21, the compensation region 22 and the body region 13 are associated with an electric field.

When the transistor device is in the off-state, an avalanche breakthrough occurs if the maximum of the electric field reaches a critical value, which is usually referred to as critical electric field $E_C$. The drain-source voltage at which an avalanche breakdown occurs, that is, at which the magnitude of the electric field reaches the critical level $E_{CRIT}$ is the breakdown voltage or voltage blocking capability of the transistor device. The level of critical electric field $E_{CRIT}$ is a material constant of the semiconductor material of the semiconductor body 100. An avalanche breakdown occurs when the electric field generated by ionized dopant atoms in the drift region 21 and corresponding counter charges in the body region 13 reaches the critical electrical field. Absent the compensation region 22 the level of the drain-source voltage $V_{DS}$ at which the critical electrical field is reached is dependent on the doping concentration of the drift region 21 and, therefore, dependent on the number of dopant atoms that can be ionized when the pn-junction between the body region 13 and the drift region 21 is reverse biased. If, however, like in the transistor device explained herein before, there is a compensation region 22 adjoining the drift region 21, ionized dopant atoms in the drift region 21 find corresponding counter charges not only in the body region 13 but also in the compensation region 22. By this, the doping concentration of the drift region 21 can be increased without decreasing the voltage blocking capability of the transistor device. Increasing the doping concentration of the drift region 21, however, is beneficial in view of the on-resistance and, more particularly, the specific on-resistance of the transistor device.

If the transistor device is in the off-state and the drain-source voltage $V_{DS}$ reaches the breakdown voltage level an avalanche breakdown occurs. An avalanche breakdown may occur, for example, if a load connected in series with the transistor device forces a current through the transistor device in the off-state. A load that is capable of driving a current through the transistor device in the off-state is an inductive load, for example. After the avalanche breakdown has occurred, a drain-source current may flow through the transistor device between the drain node and the source until the drain-source voltage $V_{DS}$ falls below the breakdown voltage level. An operation state of the transistor device after an avalanche breakdown has occurred is referred to as avalanche state in the following. A current flowing through the transistor device in the avalanche state is referred to as avalanche current in the following.

In the avalanche state of the transistor device, there is a charge carrier plasma with p-type charge carriers (holes) and n-type charge carriers (electrons) in the drift region 21 and in the compensation region 22. At the beginning of the avalanche breakdown, charge carriers are generated at a position where the electric field has a maximum (peak). These charge carriers are accelerated by the electric field and, by impact ionization, generate new charge carriers. "Impact ionization" means that a kinetic energy of an accelerated charge carrier when it collides with an atom in the crystal lattice of the drift region 21 is higher than an ionization energy of the semiconductor material (the band gap), so that an electron-hole pair is created by transferring an electron from the valence band into the conduction band.

It is desirable for the transistor device to withstand the avalanche state for a certain time without being damaged or destroyed and, after the drain-source voltage $V_{DS}$ has fallen below the breakdown voltage, to return into an off-state in which at most a leakage current flows and from which the transistor device can be switched into the on-state.

According to one example, a first type doping concentration $N_1$ of the drift region 21 is higher than a first doping level $L_1$ and a second doping concentration $N_2$ of the compensation region 22 is higher than a second doping level $L_2$, where $$L_1 > 1.2 \cdot \frac{\varepsilon_S \cdot E_C}{2 \cdot q \cdot w_1} \tag{1a}$$

$$L_2 > 1.2 \cdot \frac{\varepsilon_S \cdot E_C}{2 \cdot q \cdot w_2}, \tag{1b}$$

and where $\varepsilon_S$ is the dielectric constant of a semiconductor material of the drift region and the compensation region, $E_C$ is the critical electric field for an avalanche breakdown of the semiconductor material, q is the elementary charge, $w_1$ is a width of the drift region 21 in a direction perpendicular to the current flow direction, and $w_2$ is a width of the compensation region 22 in the direction perpendicular to the current flow direction. In the following, the width $w_1$ of the drift region 21 is referred to as first width $w_1$ and the width $w_2$ of the compensation region 22 is referred to as second width $w_2$. Referring to the explanation above, the drift regions 21 of neighboring drift and compensation cells 20 may be formed by one semiconductor region 23 of the first doping type and the compensation regions of neighboring drift and compensation cells 20 may be formed by one semiconductor region 24 of the second doping type. According to one example, the drift regions 21 and the compensation regions 22 substantially have the same width in the first lateral direction. In this case, the first width $w_1$ and the second width $w_2$ can be expressed as $$w_1 = w_2 = p/4 \tag{2},$$

where p is the pitch explained with reference to FIG. 1.

According to one example, the semiconductor material of the drift region 21 and the compensation region 22 is silicon (Si). In this example, the critical electric field $E_C$ is 2.5E5 V/cm and the dielectric constant $\varepsilon_S$ is 1.04·1E-12 As/Vcm According to one example, the first width $w_1$ and the second width $w_2$ are each selected from a range of between 0.2 micrometers and 5 micrometers, in particular between 0.2 micrometers and 2 micrometers. According to one example, $w_1$ and $w_2$ are substantially equal.

By selecting the doping concentrations $N_1$ and $N_2$ of the drift region 21 and the compensation region 22 in accordance with equations (1a) and (1b), a low resistance in particular of the drift region 21 and, therefore, a low specific on-resistance may be obtained. According to one example, the first doping level $L_1$ and the second doping level $L_2$ are higher than given by equations (1a) and (1b) and given as follows:

$$L_1 > 1.5 \cdot \frac{\varepsilon_S \cdot E_C}{2 \cdot q \cdot w_1} \tag{3a}$$

$$L_2 > 1.5 \cdot \frac{\varepsilon_S \cdot E_C}{2 \cdot q \cdot w_2}. \tag{3b}$$

Referring to FIG. 9, the drift and compensation cell, in the current flow direction z, has a first end $20_1$ and a second end $20_2$ opposite the first end. In the example shown in FIG. 9, the first end $20_1$ is the end of the drift and compensation cell 20 facing the body region 13. The second end $20_2$ is the end of the drift and compensation cell 20 that faces the drain region 11 or the optional buffer region 12 (which are not shown in FIG. 9). In particular, the first end $20_1$ and the second end $20_2$ are at positions where the pn-junction between the drift region 21 and the compensation region 22 ends in the current flow direction, which is the vertical direction in the example shown in FIG. 9. A length L of the drift and compensation cell 20 is a distance between the first end $20_1$ and the second end $20_2$. In FIG. 9, z1 denotes a position of the first end $20_1$ in the semiconductor body 100, and z2 denotes a position of the second end $20_2$. The length L is then given by L=|z2−z1|. According to one example, the length L is selected from a range of between 30 micrometers (μm) and 100 micrometers. Based on this, the transistor device may be designed to have a voltage blocking capability of between 400V and 1200V.

Referring to FIG. 9, the drift and compensation cell 20 further includes a first intermediate position z3 spaced apart from the first end $20_1$ and the second end $20_2$, and a second intermediate position z4 spaced apart from the first end $20_1$ and the second end $20_2$. In this example, the first intermediate position z3 is closer to the first end $20_1$ (at position z1) than to the second end $20_2$ (at position z2), and the second intermediate position z4 is closer to the second end $20_2$ than the first end $20_1$. According to one example, a distance between the first end $20_1$ and the first intermediate position z3, that is, |z3−z1| is selected from between 40% and 60% of the length L, and a distance between the second intermediate position z4 and second end $20_2$, that is |z4−z2| is selected from between 40% and 60% of the length L of the drift and compensation cell.

Each of the drift region 21 and the compensation region 22 has a doping profile in the current flow direction z. The doping profile represents the doping concentration of the respective region 21 or 22 at each position in the current flow direction z. The "doping concentration" is the doping concentration in the middle of the respective region 21, 22 for example. The "middle" of the drift region 21 is at a position in the first lateral direction x that is spaced apart by 50% of the first width $w_1$ from the pn-junction between the drift region 21 and the compensation region, and the "middle" of the compensation region 22 is at a position in the first lateral direction x that is spaced apart by 50% of the second width $w_2$ from the pn-junction. According to another example, the doping concentration represented by the doping profile is the average doping concentration of the respective region 21, 23 along the respective width. In this case, $N_1(z0)$ for example, denotes the average doping concentration of the drift region 21 across the first width $w_1$ at the vertical position z0.

Figure 10:
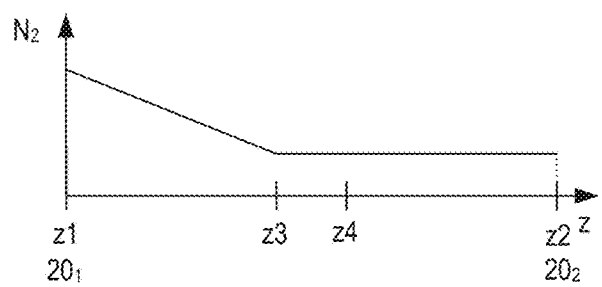
FIG. 10 illustrates one example of a doping profile of the compensation region 22 shown in FIG. 9.

According to one example, the doping concentration $N_2$ of the compensation region 22 monotonically increases between the first intermediate position z3 and the first end $20_1$. This parameter is referred to as doping parameter in the following. According to one example, this parameter is the doping concentration itself so that the doping concentration $N_2$ of the compensation region 22 monotonically increases between the first intermediate position z3 and the first end $20_1$. This is schematically illustrated in FIG. 10 which illustrates the doping concentration $N_2$ of the compensation region 22 between the first end $20_1$ and the second end $20_2$, that is, between positions z1 and z2. Between the first intermediate position z3 and the second end $20_2$, the doping concentration $N_2$ of the compensation region 22 is substantially constant, according to one example.

The doping profile explained with reference to FIG. 10 and the other doping profiles explained below may be implemented additionally or alternatively to having doping concentrations as defined by equations (1a) and (1b), or (2a) and (2b). "Additionally" means that in the doping profiles the minimum doping concentration is given by equations (1a) and (1b) or (2a) and (2b). "Alternatively" means that the minimum doping concentration is lower than given by these equations, for example, $$L_1 > 1.0 \cdot \frac{\varepsilon_S \cdot E_C}{2 \cdot q \cdot w_1} \text{ and } L_2 > 1.0 \cdot \frac{\varepsilon_S \cdot E_C}{2 \cdot q \cdot w_2}.$$

Figure 11:
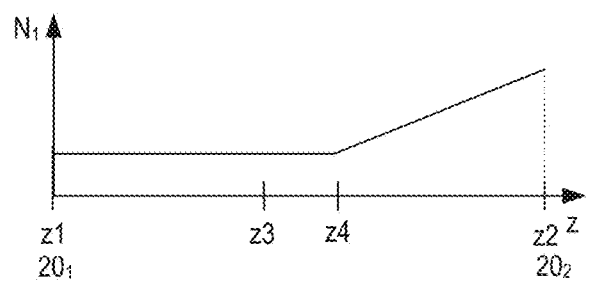
FIG. 11 shows an example of a doping profile of the drift region shown in FIG. 9.

According to one example, a doping parameter of the doping profile that represents the doping concentration $N_1$ of the drift region 21 monotonically increases between the second intermediate position z4 and the second end $20_2$. According to one example, this parameter is the doping concentration itself so that the doping concentration $N_1$ of the drift region 21 monotonically increases between the first intermediate position z3 and the first end $20_1$. This is illustrated in FIG. 11 which schematically illustrates the doping concentration $N_1$ of the drift region 21 between the first end $20_1$ and the second end $20_2$. According to one example, the doping concentration $N_1$ of the drift region 21 is substantially constant between the second intermediate position z4 and the first end z 1.

According to one example, the second type doping concentration $N_2$ of the compensation region 22 at the first end $20_1$ (at position z1) is between 3% and 20%, in particular between 3% and 10%, higher than the second type doping concentration of the compensation region 22 at the first intermediate position z3. That is, $N_2(z1)=a \cdot N_2(z3)$, where $N_2(z1)$ is the doping concentration at the first end $20_1$. $N_2(z3)$ is the doping concentration at the first intermediate position z3, and "a" is selected from between 1.03 and 1.20, in particular between 1.03 and 1.10. According to one example, the first type doping concentration $N_1$ of the drift region 21 at the second end $20_2$ is between 3% and 20%, in particular between 3% and 10%, higher than the doping concentration $N_1$ at the second intermediate position z4. That is, $N_1(z2)=b \cdot N_1(z4)$, where $N_1(z2)$ is the doping concentration at the second end $20_2$, $N_1(z4)$ is the doping concentration at the second intermediate position z4, and "b" is selected from between 1.03 and 1.20, in particular from between 1.03 and 1.10.

Figure 12:
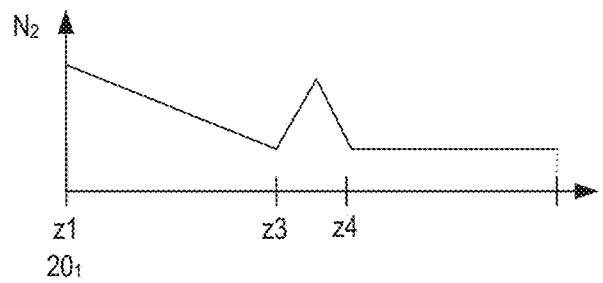
FIG. 12 illustrates one example of a doping profile of the compensation region 22 shown in FIG. 9.

FIG. 12 shows a doping profile of the compensation region 22 according to another example. The doping profile shown in FIG. 12 is a modification of the doping profile shown in FIG. 10 and includes a peak of the doping concentration between the first intermediate position z3 and the second intermediate position z4. According to one example, the peak concentration is between 3% and 20%, in particular between 3% and 10%, higher than the doping concentration between the second intermediate position z4 and the second end $20_2$.

Figure 13:
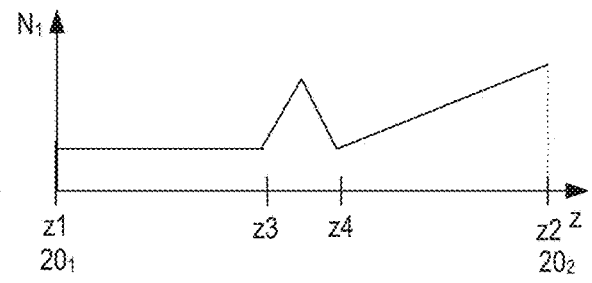
FIG. 13 shows an example of a doping profile of the drift region shown in FIG. 9.

FIG. 13 shows a doping profile of the doping concentration $N_1$ of the drift region 21 according to another example. The doping profile shown in FIG. 13 is modification of the doping profile shown in FIG. 11 and includes a peak of the doping concentration between the first intermediate position z3 and the second intermediate position z4. According to one example, the peak concentration is between 3% and 20%, in particular between 3% and 10%, higher than the doping concentration between the first end $20_1$ and the first intermediate position z3.

Figure 14:
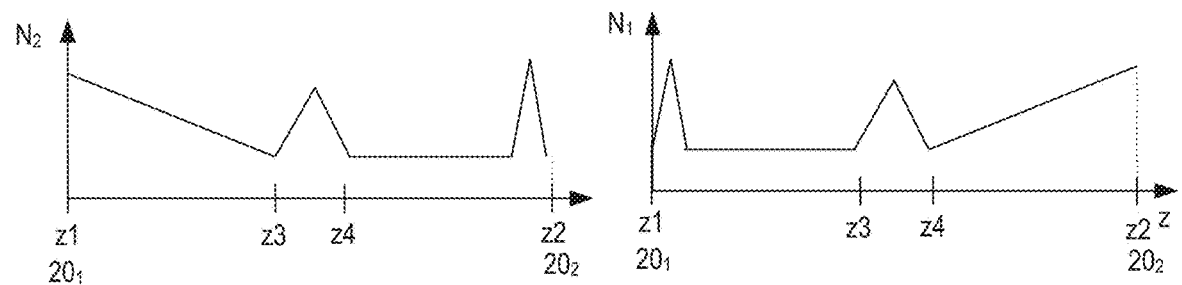
FIG. 14 illustrates one example of a doping profile of the compensation region 22 shown in FIG. 9.

FIG. 14 shows a doping profile of the doping concentration $N_2$ of the compensation region 22 according to another example. In this example, the doping concentration $N_2$ has a peak of the doping concentration close to the second end $20_2$. "Close to" in this context means that a distance between the peak and the second end $20_2$ is less than 10% of a distance between the second end $20_2$ and the second intermediate position z4. According to one example, the peak concentration is between 3% and 20%, in particular between 3% and 10%, higher than a doping concentration in remaining sections between the second intermediate position z4 and the second end $20_2$. In the example shown in FIG. 14, the peak close to the second end $20_2$ is additional to the peak between the first intermediate position z3 and the second intermediate position z4. This, however, is only an example. According to another example (not shown) the peak between the intermediate positions z3 and z4 is omitted.

Figure 15:
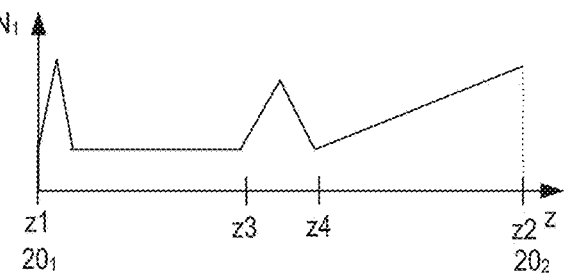
FIG. 15 shows an example of a doping profile of the drift region shown in FIG. 9.

FIG. 15 shows a doping profile of the doping concentration $N_1$ of the drift region 21 according to another example. In this example, the doping concentration $N_1$ includes a peak of the doping concentration close to the first end $20_1$. "Close to" in this context means that a distance between the peak and the first end $20_1$ is less than 10% of a distance between the first end 20, and the first intermediate position z3. According to one example, the peak concentration is between 3% and 20%, in particular between 3% and 10%, higher than a doping concentration in a remaining section between the first end $20_1$ and the first intermediate position z3.

Figure 16:
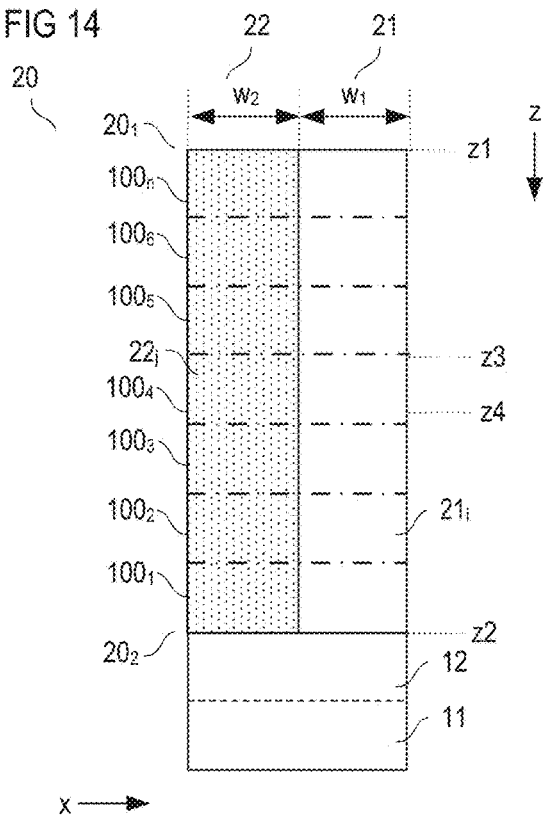
FIG. 16 shows a vertical cross sectional view of a drift and compensation cell that is formed based on a plurality of epitaxial layers.

The drift end compensation cells 20 may be formed by a conventional multi-epitaxial process. In this process, a plurality of epitaxial layers are formed on top of each other. These epitaxial layers may be formed on a semiconductor substrate forming the drain region 11 or on an epitaxial layer that is formed on the substrate and forms the optional buffer region 12. FIG. 16 schematically illustrates one drift compensation cell 20 that is formed based on a plurality of epitaxial layers $100_1$-$100_n$, whereas these epitaxial layers $100_1$-$100_n$ are formed on top of each other either on the drain region 11 or the optional buffer region 12. The individual epitaxial layers $100_1$-$100_n$ are illustrated by dashed and dotted lines in FIG. 16.

The drift region 21 and the compensation region 22 of each of the plurality of drift and compensation cells 20 may be formed by implanting dopant atoms into the epitaxial layers $100_1$-$100_n$, and a diffusion process. The dopant atoms in each of the epitaxial layers are implanted after the respective layer has been formed and before another epitaxial layer is formed on top of the respective layer. The diffusion process may be performed after the plurality of epitaxial layers $100_1$-$100_n$ have been formed and dopant atoms have been implanted. The diffusion process, in which the plurality of epitaxial layers $100_1$-$100_n$ are annealed for a predefined time period, serves to diffuse the implanted dopant atoms in the epitaxial layers $100_1$-$100_n$ and to electrically activate the implanted dopant atoms. Implanting the first type dopant atoms into the individual epitaxial layers $100_1$-$100_n$ to form the drift regions 21 and implanting the second type dopant atoms into the individual epitaxial layers $100_1$-$100_n$ to form the compensation regions 22 may include the use of implantation masks, so that first type dopant atoms are implanted only into those regions of the epitaxial layers $100_1$-$100_n$ in which drift regions are to be formed and that second type dopant atoms are implanted only into those regions of the epitaxial layers $100_1$-$100_n$ where compensation regions 22 are to be formed. This type of process is commonly known so that no further explanations are required in this regard.

A drift region 21 that is formed based on a multi-epitaxial process includes a plurality of drift region sections, wherein each of these drift region sections is included in one of the plurality of epitaxial layers $100_1$-$100_n$. Equivalently, a compensation region 22 that is formed based on a multi-epitaxial process includes a plurality of compensation region sections, wherein each of these sections is included in one of the epitaxial layers. A doping concentration of each of these drift region sections and compensation region sections is substantially given by a dopant dose of dopant atoms implanted into the respective epitaxial layer divided by the thickness of the epitaxial layer. In the following, $21_i$ denotes a drift region section in any one $100_i$ of the plurality of epitaxial layers $100_1$-$100_n$, and $22_j$ denotes a compensation region section in any one $100_j$ of the plurality of epitaxial layers $100_1$-$100_n$. $D_{1,i}$ denotes a dopant dose of first type dopant atoms implanted into the epitaxial layer 100, to form the drift region section $21_i$, and $D_{2,j}$ denotes the dopant dose of second type dopant atoms implanted into the epitaxial layer $100_j$ in order to form the compensation region section $22_j$. Furthermore, $d_i$ denotes a thickness of the epitaxial layer $100_i$, and $d_j$ denotes a thickness of the epitaxial layer $100_j$. An average doping concentration $N_{1,i}$ of the drift region section $21_i$ in the epitaxial layer $100_i$ is then given by $$N_{1,i}=D_{1,i}/d_i \tag{3a}$$

and an average doping concentration $N_{2,j}$ of the compensation region section $22_j$ in the epitaxial layer $100_j$ is given by $$N_{2,j}=D_{2,j}/d_j \tag{3b}$$

As can be seen from equations (3a) and (3b) a doping profile of the drift region 21 and a doping profile of the compensation region 22 can be adjusted by suitably selecting the dopant doses of first type dopant atoms and second type dopant atoms implanted into the respective epitaxial layers. A monotonic increase of the second type doping concentration in the compensation region 22 towards the first end $20_1$, as illustrated in FIG. 10 can be obtained, for example, by forming the epitaxial layers $100_1$-$100_n$ substantially with the same thickness and increasing the dopant dose of the second type dopant atoms from epitaxial layer to epitaxial layer beginning with the epitaxial layer that includes the first intermediate position z3. Equivalently an increase of the doping concentration $N_1$ of the drift region 21 towards the second end $20_2$ can be obtained by decreasing the dopant dose of the first type dopant atoms beginning with the first epitaxial layer $100_1$ towards the epitaxial layer that includes the second intermediate position z4. Peaks of the doping concentration as explained with reference to FIGS. 12 to 15 can be obtained by implanting into one epitaxial layer a dopant dose higher than dopant doses implanted into neighboring epitaxial layers.

Figure 17:
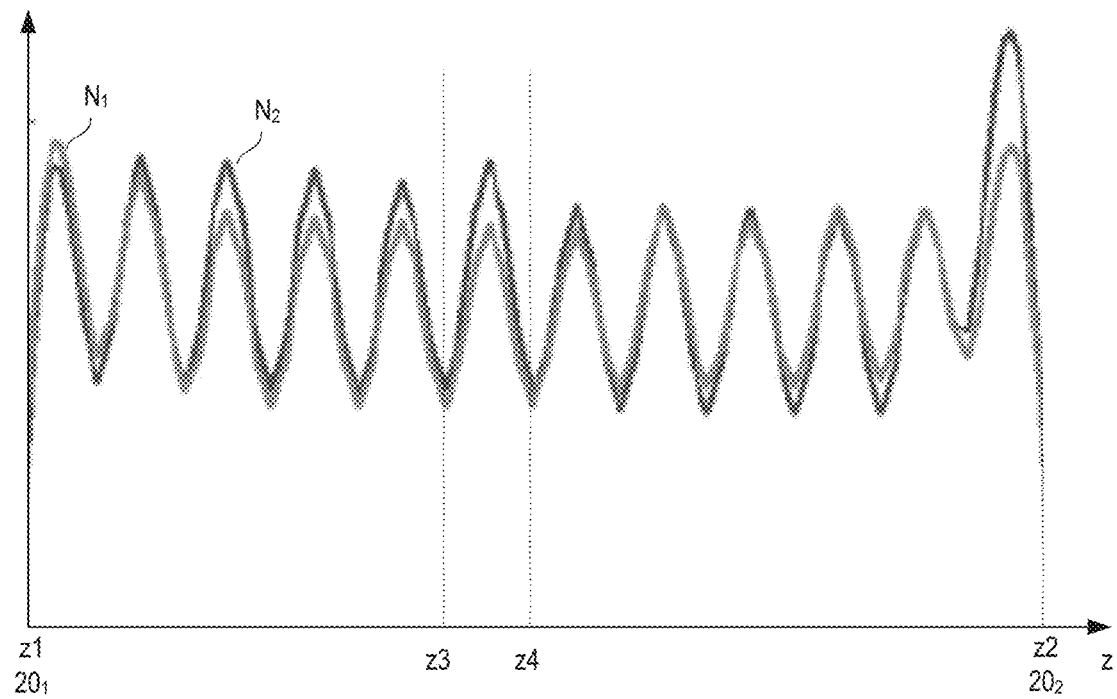
FIG. 17 shows examples of doping profiles of a drift region and a compensation region of a drift and compensation cell of the type shown in FIG. 16.

The multi-epitaxial process explained above may result in a non-homogenous doping concentration in the respective epitaxial layers. That is, the doping concentration may vary in the current flow direction within the epitaxial layers as a result of the implantation and diffusion process. This is illustrated in FIG. 17. FIG. 17 illustrates the first type doping concentration $N_1$ of one drift region and the second type doping concentration $N_2$ of one compensation region of a drift and compensation cell that has been formed based on a multi-epitaxial process. As can be seen from FIG. 17, the doping concentrations vary periodically so that each of the doping profiles $N_1$, $N_2$ includes a plurality of local minima and local maxima, wherein each of these local minima is in one of the plurality of epitaxial layers and each of these local maxima is at a border between two neighboring epitaxial layers.

According to one example, the doping parameter explained above represents local maxima in a varying doping profile. A peak of the doping concentration in this context means that a local maximum of the doping concentration at one position is higher than neighboring local maxima. Furthermore, if the doping parameter represents local maxima of the doping concentration, a monotonic increase of the doping parameter includes that local maxima in a certain direction increase from epitaxial layer to epitaxial layer. In FIG. 17, for example, the local maxima of the doping profile of the second doping concentration $N_2$ monotonically increase beginning at the first intermediate position z3 towards the first end $20_1$. According to another example, the doping parameter represents the doping dose or the average doping concentration of the drift region 21 or the compensation region 22 in on epitaxial layer. In this case, a monotonic increase of the doping parameter includes that the doping dose or the average doping concentration a certain direction increases from epitaxial layer to epitaxial layer.

Based on one or more of the measures explained above, a transistor device with a remarkably low specific on-resistance such as lower than 0.6 Ohm·mm$^2$ or even lower than 0.45 Ohm·mm$^2$ at a voltage blocking capability of 600V may be obtained.

Figure 18:
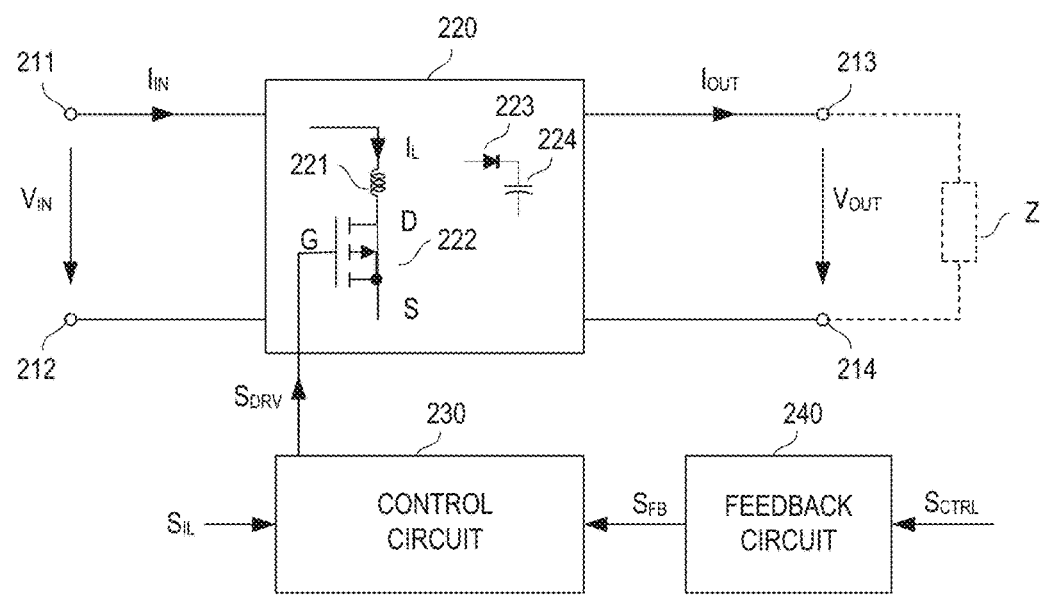
FIG. 18 shows a block diagram of a power converter circuit.

The transistor device explained before is, in particular, suitable to be used as an electronic switch in a power converter circuit (switched mode power supply, SMPS). A block diagram of a power converter circuit according to one example is shown in FIG. 18. According to FIG. 18, the power converter includes an input configured to receive an input voltage $V_{IN}$ and an input current $I_{IN}$, and an output configured to supply an output voltage $V_{OUT}$ and an output current $I_{OUT}$. The input may include a first input node 211 and a second input node 212, and the output may include a first output node 213 and a second output node 214. A load Z (illustrated in dashed lines in FIG. 1) may receive the output voltage $V_{OUT}$ and the output current $I_{OUT}$ available at the output 213, 214.

An inductor and rectifier circuit 220 receives the input voltage $V_{IN}$ and the input current $I_{IN}$ and supplies the output voltage $V_{OUT}$ and the output current Iour based on the input voltage $V_{IN}$ and the input current $I_{IN}$. The inductor and rectifier circuit 220 includes an inductor 221 connected in series with an electronic switch 222 and a rectifier circuit. The electronic switch 222 is a transistor device in accordance with one of the examples explained above and is represented by its circuit symbol in FIG. 18. The transistor device 222 being connected in series with the inductor 221 includes that a drain-source path D-S between the drain node D and the source node S is connected in series with the inductor 221. The electronic switch 222 connected in series with the inductor 221 is driven by a drive signal $S_{DRV}$ generated by a controller 230. Referring to FIG. 18, the controller 230 may generate the drive signal $S_{DRV}$ based on an inductor current signal $S_{IL}$ and a feedback signal $S_{FB}$ generated by a feedback circuit 240.

The inductor current signal $S_{IL}$ represents a current $I_L$ through the inductor 221. According to one example, the inductor current signal $S_{IL}$ is proportional to the inductor current $I_L$. The inductor current signal $S_{IL}$ may be generated based on the inductor current $I_L$ by any type of current measurement circuit (not shown) that is configured to measure the current $I_L$ through the inductor 221.

According to one example, the feedback circuit 240 is configured to generate the feedback signal $S_{FB}$ based on a control signal $S_{CTRL}$. The control signal $S_{CTRL}$ represents at least one parameter of the power converter circuit that is to be regulated. According to one example, the power converter circuit is configured to regulate the output voltage $V_{OUT}$. In this case, the control signal $S_{CTRL}$ represents the output voltage $V_{OUT}$. According to one example, the control signal $S_{CTRL}$ is proportional to the parameter to be regulated. The control signal $S_{CTRL}$ can be generated using any type of measurement circuit (not shown) that is suitable to measure the parameter that is to be regulated.

The drive signal $S_{DRV}$ is a pulse-width modulated (PWM) signal according to one example, so that by varying a duty cycle of the drive signal $S_{DRV}$, the input current IN and, therefore, the input power, which is the input voltage $V_{IN}$ multiplied with the input current $I_{IN}$, can be controlled in order to regulate the at least one parameter that is to be controlled, such as the output voltage $V_{OUT}$. A PWM drive signal includes a plurality of successive drive cycles, with each drive cycle including an on-period in which the electronic switch 222 is switched on and an off-period in which the electronic switch 222 is switched off. The duty-cycle is the ratio between a duration $T_{ON}$ of the on-period and a duration T of the drive cycle, where $T=T_{ON}+T_{OFF}$, where $T_{OFF}$ denotes a duration of the off-period.

FIG. 18 does not show in detail how the inductor 221 and the electronic switch 222 are connected to the input 211, 212. The way of how the inductor 221 and the electronic switch 222 are connected to the input 211, 212 is dependent on the specific topology of the inductor and rectifier circuit 220. One example of a topology is shown in FIG. 19.

In the example shown in FIG. 19, the inductor and rectifier circuit 220 is implemented with a flyback converter topology. In this topology, the inductor 221 is a transformer with a primary winding $221_P$ and a secondary winding $221_S$. The primary winding $221_P$ is connected in series with the electronic switch 222, whereas this series circuit is connected between the first input node 211 and the second input node 212. A series circuit with the secondary winding $221_S$ and the rectifier element 223 is connected in parallel with the capacitor 224, whereas the capacitor 224 is connected between the first output node 213 and the second output node 214. The output voltage $V_{OUT}$ is available across the capacitor 224. The primary winding $221_P$ and the secondary winding $221_S$ have opposite winding senses. A winding ratio between the number of turns of the primary winding $221_P$ and the number of turns of the secondary winding $221_S$ is given by n: 1, that is, the number of turns of the primary winding 221 is n times the number of turns of the secondary winding $221_S$. In the flyback converter topology, a current flows through the primary winding $221_P$ during the on-period while the current through the secondary winding $221_S$ is zero. During the off-period, the current through the primary winding $221_P$ is zero and a current flows through the secondary winding. The current through the primary winding increases during the on-period, and the current through the secondary winding $221_S$ decreases during the off-period.

FIGS. 20A to 20C illustrate three different examples of how the gate node G of the transistor device 222 may receive the drive signal $S_{DRV}$. For the purpose of explanation it is assumed that the transistor device 222 is an n-type device that switches on when the drive signal has a signal level higher than a threshold voltage of the transistor device and switches off when the drive signal has a signal level lower than the threshold voltage of the transistor device. More specifically, the transistor device switches on when an internal gate-source capacitance (not shown) has been charged to above the threshold voltage and switches off when the internal gate-source capacitance (not shown) has been discharged to below the threshold voltage According to one example shown in FIG. 20A, the gate node receives the drive signal $S_{DRV}$ via a single resistor 225. In this example, the gate-source capacitance is charged and discharged via the resistor 425 so that the transistor device switches on and off substantially at the same speed.

In the example shown in FIG. 20B, a series circuit with a rectifier element 426 such as a diode and another resistor 427 is connected in parallel with the resistor 425. A polarity of the rectifier element 426 is such that the internal gate source capacitance can be discharged but not charged via the other resistor 427. In this circuit, resistor 425 governs switching on and a parallel circuit with the resistor 425 and the other resistor 427 governs switching off, so that the transistor devices switches on and off at different speeds.

The example shown in FIG. 20C is based on the example shown in FIG. 20B and additionally includes a further rectifier element 428 such as a diode connected in series with the resistor 425. A polarity of the further rectifier element 428 is such that the internal gate source capacitance can be charged but not discharged via the resistor 425. In this circuit, resistor 425 governs switching on and the other resistor 427 governs switching off, so that the transistor devices switches on and off at different speeds.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power converter circuit, comprising:
an inductor and rectifier circuit configured to receive an input voltage and an input current and to supply an output voltage and an output current based on the input voltage and the input current, the inductor and rectifier circuit comprising an inductor connected in series with an electronic switch, and a rectifier circuit; and
a controller configured to generate a drive signal for driving the electronic switch of the inductor and rectifier circuit,
wherein the electronic switch comprises:
a drain node, a source node and a gate node;
a plurality of drift and compensation cells each comprising a drift region of a first doping type and a compensation region of a second doping type complementary to the first doping type; and
a control structure connected between the drift region of each of the drift and the compensation cells and the source node,
wherein the drift region of each of the plurality of drift and compensation cells is coupled to the drain node and the compensation region of each of the plurality of drift and compensation cells is coupled to the source node,
wherein a first type doping concentration $N_1$ of the drift region is higher than a first doping level $L_1$ and a second type doping concentration $N_2$ of the compensation region is higher than a second doping level $L_2$, wherein $L_1 > 1.2 \cdot \dfrac{\varepsilon_S \cdot E_C}{2 \cdot q \cdot w_1}$, wherein $L_2 > 1.2 \cdot \dfrac{\varepsilon_S \cdot E_C}{2 \cdot q \cdot w_2}$, wherein $\varepsilon_S$ is the dielectric constant of a semiconductor material of the drift region and the compensation region, $E_C$ is the critical electric field for an avalanche breakdown of the semiconductor material, q is the elementary charge, $w_1$ is a width of the drift region in a direction perpendicular to a current flow direction, and $w_2$ is a width of the compensation region in the direction perpendicular to the current flow direction.

2. The power converter circuit of claim 1, wherein the controller is configured to generate the drive signal based on an inductor current signal and a feedback signal generated by a feedback circuit, and wherein the inductor current signal represents a current through the inductor of the inductor and rectifier circuit.

3. The power converter circuit of claim 2, wherein the inductor current signal is proportional to the inductor current.

4. The power converter circuit of claim 2, wherein the feedback circuit is configured to generate the feedback signal based on a control signal.

5. The power converter circuit of claim 4, wherein the control signal represents at least one parameter of the power converter circuit that is to be regulated.

6. The power converter circuit of claim 5, wherein the control signal is proportional to the at least one parameter of the power converter circuit to be regulated.

7. The power converter circuit of claim 4, wherein the power converter circuit is configured to regulate the output voltage, and wherein the control signal represents the output voltage.

8. The power converter circuit of claim 1, wherein the drive signal is a pulse-width modulated (PWM) signal, and wherein the controller is configured to vary a duty cycle of the PWM drive signal so as to control the input current in order to regulate at least one parameter of the power converter circuit that is to be controlled.

9. The power converter circuit of claim 8, wherein the at least one parameter of the power converter circuit that is to be controlled is the output voltage.

10. The power converter circuit of claim 1, wherein the inductor and rectifier circuit has a flyback converter topology, wherein the inductor is a transformer with a primary winding and a secondary winding, wherein the primary winding is connected in series with the electronic switch, wherein a series circuit with the secondary winding and the rectifier circuit is connected in parallel with a capacitor, and wherein the output voltage is available across the capacitor.

11. The power converter circuit of claim 1, wherein the gate node of the electronic switch is configured to receive the drive signal via a resistor.

12. The power converter circuit of claim 11, further comprising a series circuit with a rectifier element and another resistor connected in parallel with the resistor, wherein a polarity of the rectifier element is such that an internal gate source capacitance of the electronic switch can be discharged but not charged via the other resistor.

13. The power converter circuit of claim 12, further comprising a further rectifier element connected in series with the resistor, wherein a polarity of the further rectifier element is such that the internal gate source capacitance of the electronic switch can be charged but not discharged via the resistor.

14. A power converter circuit, comprising:
an inductor and rectifier circuit configured to receive an input voltage and an input current and to supply an output voltage and an output current based on the input voltage and the input current, the inductor and rectifier circuit comprising an inductor connected in series with an electronic switch, and a rectifier circuit; and
a controller configured to generate a drive signal for driving the electronic switch of the inductor and rectifier circuit,
wherein the electronic switch comprises:
a drain node,
a source node and a gate node;
a plurality of drift and compensation cells each comprising a drift region of a first doping type and a compensation region of a second doping type complementary to the first doping type; and
a control structure connected between the drift region of each of the drift and the compensation cells and the source node,
wherein the drift region of each of the plurality of drift and compensation cells is coupled to the drain node and the compensation region of each of the plurality of drift and compensation cells is coupled to the source node,
wherein each of the plurality of drift and compensation cells, in a current flow direction of the transistor device, has a first end, a second end opposite the first end, a first intermediate position spaced apart from the first end and the second end, and a second intermediate position spaced apart from the first end and the second end,
wherein a first doping parameter of a first doping profile that represents a doping concentration of the drift region in the current flow direction monotonically increases between the first intermediate position and the first end, and
wherein a second doping parameter of a second doping profile that represents a doping concentration of the compensation region in the current flow direction monotonically increases between the second intermediate position and the second end.

15. The power converter circuit of claim 14, wherein the controller is configured to generate the drive signal based on an inductor current signal and a feedback signal generated by a feedback circuit, and wherein the inductor current signal represents a current through the inductor of the inductor and rectifier circuit.

16. The power converter circuit of claim 15, wherein the inductor current signal is proportional to the inductor current.

17. The power converter circuit of claim 15, wherein the feedback circuit is configured to generate the feedback signal based on a control signal.

18. The power converter circuit of claim 17, wherein the control signal represents at least one parameter of the power converter circuit that is to be regulated.

19. The power converter circuit of claim 18, wherein the control signal is proportional to the at least one parameter of the power converter circuit to be regulated.

20. The power converter circuit of claim 17, wherein the power converter circuit is configured to regulate the output voltage, and wherein the control signal represents the output voltage.

21. The power converter circuit of claim 14, wherein the drive signal is a pulse-width modulated (PWM) signal, and wherein the controller is configured to vary a duty cycle of the PWM drive signal so as to control the input current in order to regulate at least one parameter of the power converter circuit that is to be controlled.

22. The power converter circuit of claim 21, wherein the at least one parameter of the power converter circuit that is to be controlled is the output voltage.

23. The power converter circuit of claim 14, wherein the inductor and rectifier circuit has a flyback converter topology, wherein the inductor is a transformer with a primary winding and a secondary winding, wherein the primary winding is connected in series with the electronic switch, wherein a series circuit with the secondary winding and the rectifier circuit is connected in parallel with a capacitor, and wherein the output voltage is available across the capacitor.

24. The power converter circuit of claim 14, wherein the gate node of the electronic switch is configured to receive the drive signal via a resistor.

25. The power converter circuit of claim 24, further comprising a series circuit with a rectifier element and another resistor connected in parallel with the resistor, wherein a polarity of the rectifier element is such that an internal gate source capacitance of the electronic switch can be discharged but not charged via the other resistor.

26. The power converter circuit of claim 25, further comprising a further rectifier element connected in series with the resistor, wherein a polarity of the further rectifier element is such that the internal gate source capacitance of the electronic switch can be charged but not discharged via the resistor.

* * * * *